United States Patent
Park et al.

(10) Patent No.: US 11,939,698 B2
(45) Date of Patent: Mar. 26, 2024

(54) WAFER MANUFACTURING METHOD, EPITAXIAL WAFER MANUFACTURING METHOD, AND WAFER AND EPITAXIAL WAFER MANUFACTURED THEREBY

(71) Applicant: SENIC INC., Cheonan-si (KR)

(72) Inventors: Jong Hwi Park, Suwon-si (KR); Jung-Gyu Kim, Suwon-si (KR); Eun Su Yang, Suwon-si (KR); Byung Kyu Jang, Suwon-si (KR); Jung Woo Choi, Suwon-si (KR); Yeon Sik Lee, Suwon-si (KR); Sang Ki Ko, Suwon-si (KR); Kap-Ryeol Ku, Suwon-si (KR)

(73) Assignee: SENIC INC., Cheonan-si (KR)

( * ) Notice: Subject to any disclaimer, the term of this patent is extended or adjusted under 35 U.S.C. 154(b) by 769 days.

(21) Appl. No.: 17/088,078

(22) Filed: Nov. 3, 2020

(65) Prior Publication Data
US 2021/0372005 A1    Dec. 2, 2021

(30) Foreign Application Priority Data

May 29, 2020 (KR) .................. 10-2020-0064716

(51) Int. Cl.
*C30B 29/36* (2006.01)
*C30B 23/02* (2006.01)
*C30B 33/10* (2006.01)
*H01L 21/306* (2006.01)
*H01L 29/16* (2006.01)

(52) U.S. Cl.
CPC ............. *C30B 29/36* (2013.01); *C30B 23/02* (2013.01); *C30B 33/10* (2013.01); *H01L 21/30625* (2013.01); *H01L 29/1608* (2013.01)

(58) Field of Classification Search
None
See application file for complete search history.

(56) References Cited

U.S. PATENT DOCUMENTS

| 2010/0289033 A1 | 11/2010 | Ohtani et al. |
| 2011/0183113 A1 | 7/2011 | Sakaguchi |
| 2016/0040317 A1 | 2/2016 | Ueta et al. |
| 2016/0204019 A1 | 7/2016 | Ishii et al. |

(Continued)

FOREIGN PATENT DOCUMENTS

| CN | 105801146 A | 7/2016 |
| CN | 112746317 A | 5/2021 |

(Continued)

OTHER PUBLICATIONS

JP 2010064919 A eng machine translation (Year: 2010).*

(Continued)

*Primary Examiner* — Jeffrey D Washville
(74) *Attorney, Agent, or Firm* — NSIP Law (57) ABSTRACT

A wafer manufacturing method, an epitaxial wafer manufacturing method, and a wafer and epitaxial wafer manufactured thereby, are provided. The wafer manufacturing method enables the manufacture of a wafer with a low density of micropipe defects and minimum numbers of particles and scratches. The epitaxial wafer manufacturing method enables the manufacture of an epitaxial wafer that has low densities of defects such as downfall, triangular, and carrot defects, exhibits excellent device characteristics, and improves the yield of devices.

6 Claims, 4 Drawing Sheets

(56) References Cited

U.S. PATENT DOCUMENTS

| | | | |
|---|---|---|---|
| 2016/0218003 A1 | 7/2016 | Hirooka et al. | |
| 2018/0363166 A1 | 12/2018 | Wada et al. | |
| 2020/0185220 A1 | 6/2020 | Daigo | |
| 2021/0123843 A1 | 4/2021 | Park et al. | |

FOREIGN PATENT DOCUMENTS

| | | | |
|---|---|---|---|
| JP | 2006-303329 A | | 11/2006 |
| JP | 2010-64918 A | | 3/2010 |
| JP | 2010064919 A | * | 3/2010 |
| JP | 2010-87106 A | | 4/2010 |
| JP | 2013-35705 A | | 2/2013 |
| JP | 2013-177256 A | | 9/2013 |
| JP | 2014-58411 A | | 4/2014 |
| JP | 5630400 B2 | | 11/2014 |
| JP | 2016-37441 A | | 3/2016 |
| JP | 2017-52674 A | | 3/2017 |
| JP | 2018-140884 A | | 9/2018 |
| JP | 2019-46855 A | | 3/2019 |
| KR | 10-0572556 B1 | | 4/2006 |
| KR | 10-0831019 B1 | | 5/2008 |
| KR | 10-2008-0113682 A | | 12/2008 |
| KR | 10-2010-0089103 A | | 8/2010 |
| KR | 10-2012-0101097 A | | 9/2012 |
| KR | 10-2013-0053481 A | | 5/2013 |
| KR | 10-2015-0034351 A | | 4/2015 |
| KR | 10-2015-0107104 A | | 9/2015 |
| KR | 10-2015-0109444 A | | 10/2015 |
| KR | 10-2017-0041223 A | | 4/2017 |
| KR | 10-2104751 B1 | | 4/2020 |
| WO | WO 02/099169 A1 | | 12/2002 |
| WO | WO 2014/123036 A1 | | 8/2014 |

OTHER PUBLICATIONS

Extended European search report dated Sep. 7, 2021, in counterpart European Patent Application No. 21161288.2 (3 pages).
Japanese Office Action dated Oct. 12, 2021, in counterpart Japanese Patent Application No. 2020-141224 (5 pages in Japanese).
Japanese Office Action dated Nov. 22, 2022, in counterpart Japanese Patent Application No. 2022-003257 (5 pages in Japanese).
Japanese Office Action dated May 23, 2023, in counterpart Japanese Patent Application No. 2022-003257 (8 pages in Japanese).
Chinese Office Action dated Aug. 29, 2023, in counterpart Chinese Patent Application No. 202011097998.3 (11 pages in Chinese).

* cited by examiner

WAFER MANUFACTURING METHOD, EPITAXIAL WAFER MANUFACTURING METHOD, AND WAFER AND EPITAXIAL WAFER MANUFACTURED THEREBY

CROSS-REFERENCE TO RELATED APPLICATION

This application claims the benefit under 35 USC § 119(a) of Korean Patent Application No. 10-2020-0064716, filed on May 29, 2020, in the Korean Intellectual Property Office, the entire disclosure of which is incorporated herein by reference for all purposes.

BACKGROUND

1. Field

The following description relates to a wafer manufacturing method, an epitaxial wafer manufacturing method, and a wafer and epitaxial wafer manufactured thereby.

2. Description of Related Art

Silicon carbide has high heat resistance and mechanical strength, and is physically and chemically stable. Due to these advantages, silicon carbide has recently been utilized as a semiconductor material. Recently, there has been an increasing demand for single-crystal silicon carbide substrates for high-power devices, etc.

Single-crystal silicon carbide may be prepared by various processes such as liquid phase epitaxy (LPE), chemical vapor deposition (CVD), and physical vapor transport (PVT). According to physical vapor transport, silicon carbide as a raw material is loaded into a crucible, a seed crystal composed of single-crystal silicon carbide is arranged at the top end of the crucible, the crucible is heated by induction to sublimate the raw material, and as a result, single-crystal silicon carbide is grown on the seed crystal.

Physical vapor transport enables fast growth of single-crystal silicon carbide to produce silicon carbide ingots. Accordingly, physical vapor transport is most widely used for the production of silicon carbide ingots. However, when a crucible is heated by induction, the current density in the crucible and the internal temperature distribution of the crucible may vary depending on various factors such as characteristics of the crucible, characteristics of a heat insulating material, and process conditions, causing warpage and distortion of a final silicon carbide ingot. Such warpage and distortion may lead to an increase in the density of defects in a wafer manufactured by subsequent processing.

When an epitaxial layer is formed on a wafer manufactured from a silicon carbide ingot, mechanical damage to the wafer surface should be minimized. Unnecessary particles that are present on the wafer surface, or mechanical damage, such as scratches, to the wafer surface, may deteriorate the quality of the epitaxial layer, or may pose a risk that the characteristics and yield of a desired semiconductor device may deteriorate.

Thus, configurations of various parameters for the preparation of single-crystal silicon carbide and the manufacture of wafers should be taken into account to improve the performance and yield of semiconductor devices fabricated from the wafers.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a wafer manufacturing method, the method includes arranging a raw material and a silicon carbide seed crystal to face each other in a reactor having an internal space; controlling a temperature, a pressure, and an atmosphere of the internal space to sublimate the raw material, and grow a silicon carbide ingot from the silicon carbide seed crystal; cooling the reactor, and recovering the silicon carbide ingot; cutting the recovered silicon carbide ingot into a wafer; and planarizing the wafer, and polishing a first surface of the planarized wafer, wherein a heat insulating material surrounds an outer surface of the reactor, a heating device is configured to control the temperature of the internal space, and a density of the heat insulating material is 0.14 g/cc to 0.28 g/cc, and wherein the planarizing of the wafer comprises performing a first processing operation with a first grinding wheel which has a surface particle size of 1000 mesh to 3000 mesh, and performing a second processing operation with a second grinding wheel which has a surface particle size of 6000 mesh to 10000 mesh.

A feed rate of the first grinding wheel to the wafer in the first processing operation is 0.2 μm/s to less than 1.5 μm/s.

A feed rate of the second grinding wheel to the wafer in the second processing operation may be 0.2 μm/s to less than 1.5 μm/s.

A wafer manufacture index (Pi) value of the wafer may not be greater than 30, based on the following Equation: $Pi = Di \times Vi \times Vii \times 100$ where Di is the density of the heat insulating material (g/cc), Vi is the feed rate of the first grinding wheel (μm/s), and Vii is the feed rate of the second grinding wheel (μm/s).

The first grinding wheel may be configured to rotate at a rate of 1000 rpm to 2000 rpm.

The second grinding wheel may be configured to rotate at a rate of 600 rpm to 1800 rpm.

The planarizing of the wafer further comprises performing a chemical mechanical polishing operation.

After chemical mechanical polishing is performed on the wafer, a total length of scratches on a first surface of the wafer may be less than a diameter of the wafer, an average density of particles has a size of 0.3 μm or more is 3/cm$^2$ or less, and an average density of micropipes on the first surface is 3/cm$^2$ or less.

In a general aspect, a wafer includes a first surface and a second surface; wherein a total length of scratches on the first surface is less than a diameter of the wafer, an average density of particles which have a size of 0.3 μm or more is 3/cm$^2$ or less, and an average density of micropipes on the first surface is 3/cm$^2$ or less.

The total length of scratches on the first surface may be 2 cm or less.

The Wd value of the wafer may not be greater than 15, based on the following Equation: $Wd = (MP+1) \times (Pd+1) \times (10Sr+1)$, where MP is the average density of micropipes (/cm$^2$), Pd is the average density of particles (/cm$^2$), and Sr is the percentage of the total length of scratches relative to the diameter of the wafer (%).

The first surface may be a Si plane where a silicon atomic layer is formed, and the wafer is a 4H silicon carbide wafer of 4 inches or more.

In a general aspect, an epitaxial wafer includes a wafer comprising a first surface and a second surface; wherein a total length of scratches on the first surface is less than a diameter of the wafer, an average density of particles which have a size of 0.3 μm or more is 3/cm$^2$ or less, and an average density of micropipes on the first surface is 3/cm$^2$ or less, and wherein an epitaxial layer is formed on the first surface of the wafer.

The epitaxial layer may be configured to have an average downfall defect density of 0.3/cm$^2$ or less, an average triangular defect density of 1/cm$^2$ or less, an average carrot defect density of 2/cm$^2$ or less, and an average edge dislocation density of 4/cm$^2$ or less.

A wafer defect index (Wd) value of the wafer may not be greater than 15, based on the following Equation: Wd=(MP+1)×(Pd+1)×(10Sr+1), where MP is the average density of micropipes (/cm$^2$), Pd is the average density of particles (/cm$^2$), and Sr is the percentage of the total length of scratches relative to the diameter of the wafer (%).

In a general aspect, a silicon carbide ingot preparation method includes disposing a raw material to face a silicon carbide seed crystal in an internal space of a reactor; applying a heat insulating material to an external surface of the reactor, where the heat insulating material has a density equal to or greater than 0.14 g/cc; and growing the silicon carbide ingot from the silicon carbide seed crystal by adjusting a temperature of the reactor, depressurizing the internal space, and injecting an inert gas into the internal space to induce the growth of the silicon carbide ingot.

The reactor may be a graphite crucible.

The raw material may be a necked or surface carbonized silicon carbide powder.

The temperature of the reactor may be adjusted in a range of 2100° C. to 2500° C.

The pressure of the internal space may be in a range of 1 torr to 50 torr.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

The units "/cm$^2$" and "/wafer" in the description of defects refer to the number of defects per unit area (cm$^2$) and the number of defects observed on one surface of the wafer, respectively.

Herein, defects are detected using an optical wafer inspection system (Candela CS20, KLA-Tencor) unless otherwise specified.

When an epitaxial layer is formed on a wafer manufactured from an ingot that is prone to warpage or distortion, defects such as downfall, triangular, and carrot defects may occur in the epitaxial layer, resulting in a decrease in breakdown voltage and an increase in leakage current during operation of components such as diodes.

Wafer Manufacturing Method

Figure 4:
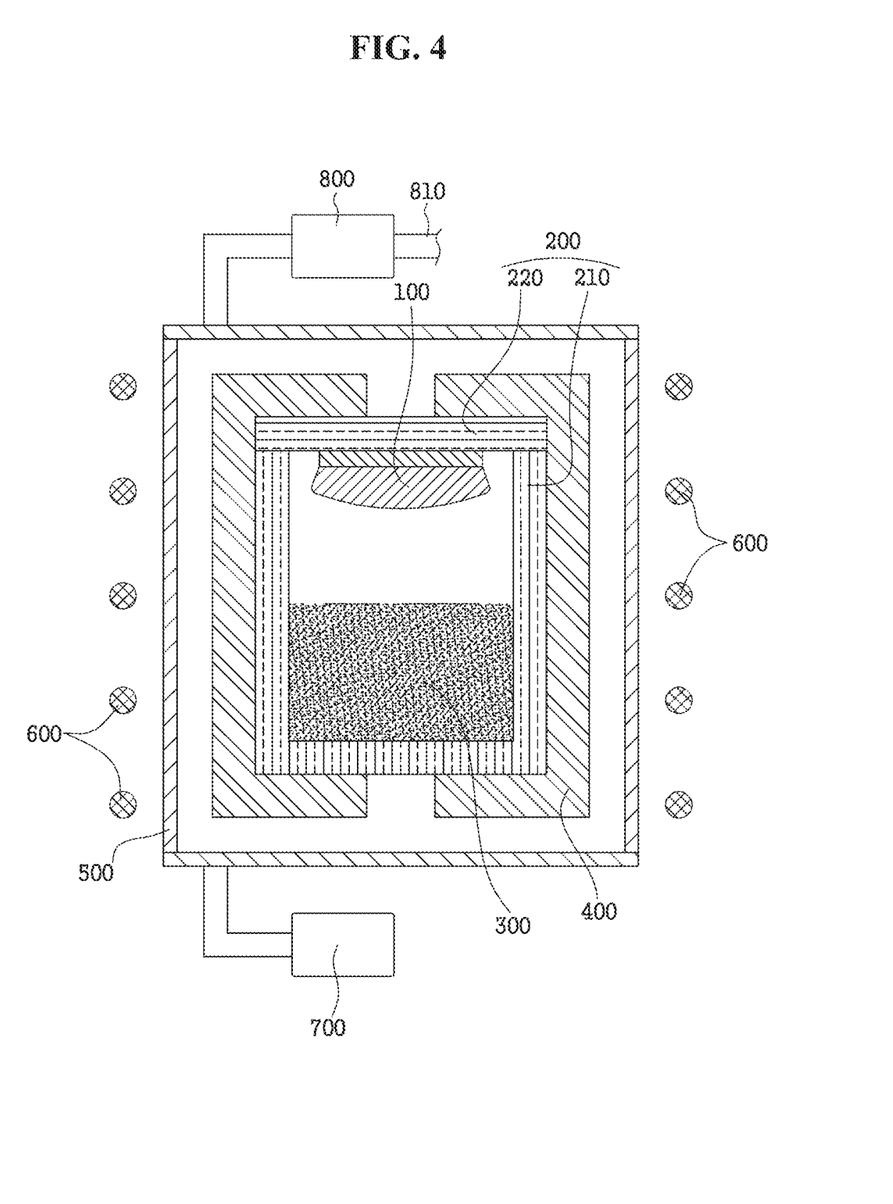
FIG. 4 illustrates a view of a system that produces a silicon carbide ingot, in accordance with one or more embodiments.

Referring to FIG. 4, a wafer manufacturing method, in accordance with one or more embodiments, includes the steps of: arranging a raw material 300 and a silicon carbide seed crystal to face each other in a reactor 200 having an internal space (preparation step); controlling the temperature, pressure, and atmosphere of the internal space to sublimate the raw material and grow a silicon carbide ingot 100 from the seed crystal (growth step); cooling the reactor and recovering the silicon carbide ingot (cooling step); cutting the recovered silicon carbide ingot into a wafer (cutting step); and planarizing the wafer and polishing the surface of the planarized wafer (processing step), wherein a heat insulating material surrounds the outer surface of the reactor, heating means controls the temperature of the reactor or the internal space, the density of the heat insulating material is 0.14 g/cc to 0.28 g/cc, and the processing step includes the substeps of processing with a first grinding wheel having a surface particle size of 1000 mesh to 3000 mesh (first processing substep) and processing with a second grinding wheel having a surface particle size of 6000 mesh to 10000 mesh (second processing substep).

As discussed herein, the shape and quality of an ingot may be improved by controlling the density of a heat insulating material of a growth container during ingot production and minimizing the occurrence of scratches and particles in a wafer during wafer processing, particularly polishing.

FIG. 4 illustrates an example system that produces a silicon carbide ingot. With reference to FIG. 4, a description will be given of the wafer manufacturing method, in accordance with one or more embodiments.

Referring to FIG. 4, in the preparation step, a raw material 300 and a silicon carbide seed crystal are arranged to face each other in a reactor 200 having an internal space.

The size of the silicon carbide seed crystal may vary depending on the size of a desired wafer and C-plane (000-1) of the silicon carbide seed crystal may be directed toward the raw material 300.

The raw material 300 may be in the form of a powder including a carbon source and a silicon source. In a non-limiting example, the raw material may be a necked or surface carbonized silicon carbide powder.

The reactor 200 may be a container where a reaction for the growth of the silicon carbide ingot occurs. The reactor 200 may be a graphite crucible, but is not limited thereto. In an example, the reactor 200 may include a body 210 having an internal space and an opening; and a cover 220 that closes the internal space. The cover 220 of the crucible may further include a seed crystal holder integrated with, or separated from, the cover. The silicon carbide seed crystal may be fixed by the seed crystal holder to face the raw material.

The reactor 200 is surrounded and fixed by a heat insulating material 400. The heat insulating material 400 surrounding the reactor is located in a reaction chamber 500 such as, but not limited to, a quartz tube. The internal temperature of the reactor 200 may be controlled by the heating devices 600 that are provided outside the heat insulating material and the reaction chamber.

The heat insulating material 400 may have a porosity in the range of 72% to 95%, 75% to 93% or 80% to 91%. The heat insulating material 400, whose porosity is in the range defined above, may reduce the formation of cracks in the grown silicon carbide ingot.

The heat insulating material 400 may have a compressive strength of 0.2 MPa or more, 0.48 MPa or more or 0.8 MPa or more. The compressive strength of the heat insulating material may be 3 MPa or less or 2.5 MPa or less. When the compressive strength of the heat insulating material is in the range defined above, good thermal/mechanical stability of the silicon carbide ingot may be ensured and the probability of ash occurrence may be lowered, thus achieving high quality of the silicon carbide ingot.

The heat insulating material 400 may include a carbonaceous felt, specifically a graphite felt. The carbonaceous felt may be a rayon- or pitch-based graphite felt.

The heat insulating material 400 may have a density of 0.14 g/cc or more, 0.15 g/cc or more, 0.168 g/cc or more, or 0.17 g/cc or more. The density of the heat insulating material may be 0.28 g/cc or less, 0.24 g/cc or less, 0.20 g/cc or less, or 0.18 g/cc or less. When the heat insulating material is applied in this range, the occurrence of warpage and distortion of the ingot may be suppressed and the formation of defects in a wafer manufactured from the ingot may be reduced.

A vacuum exhauster 700 may be in communication with the reaction chamber to control the degree of vacuum in the reaction chamber. A line 810, through which a gas is injected into the reaction chamber, is also in communication with the reaction chamber. A mass flow controller 800 may be provided in the line to control the gas injection. By these elements, the flow rates of an inert gas can be controlled in the subsequent growth and cooling steps.

The growth step may be carried out by heating the reactor 200 and the internal space of the reactor with the heating device 600. Simultaneously with, or separately from, the heating, the internal space may be depressurized to control the degree of vacuum, and an inert gas may be injected to induce the growth of the silicon carbide ingot.

The growth step may be carried out at a temperature of 2000° C. to 2600° C. and a pressure of 1 torr to 200 torr. Under these conditions, the silicon carbide ingot may be produced in a more efficient manner.

Specifically, the growth step may be carried out in the reactor 200 where the upper and lower surface temperatures may be 2100° C. to 2500° C., and the pressure of the internal space may be 1 torr to 50 torr. More specifically, the growth step may be carried out in the reactor where the upper and lower surface temperatures are 2150° C. to 2450° C. and the pressure of the internal space is 1 torr to 40 torr. Even more specifically, the growth step may be carried out in the reactor where the upper and lower surface temperatures are 2150° C. to 2350° C. and the pressure of the internal space is 1 torr to 30 torr.

Under these conditions for the growth step, higher quality of the silicon carbide ingot can be ensured.

The growth step may be carried out by heating the internal space to the temperature range defined above at a rate of 1° C./min to 10° C./min or 5° C./min to 10° C./min.

In the growth step, a predetermined amount of an inert gas may be supplied to the exterior of the reactor 200. A flow of the inert gas may be created in the internal space of the reactor 200. The inert gas may flow from the raw material 300 in the direction towards the silicon carbide seed crystal. Thus, a stable temperature gradient may be established in the reactor and the internal space.

The inert gas may be, as non-limiting examples, argon, helium or a mixture thereof.

In the cooling step, the silicon carbide ingot grown in the growth step may be cooled at a predetermined rate under a flow of an inert gas.

The cooling step may be carried out at a rate of 1° C./min to 10° C./min or 1° C./min to 5° C./min.

In the cooling step, the pressure of the internal space of the reactor 200 may be controlled simultaneously when the silicon carbide ingot is cooled. Alternatively, the pressure control may be executed separately from the cooling of the silicon carbide ingot. The pressure of the internal space may be controlled to a maximum of 760 torr.

A predetermined amount of an inert gas may be supplied to the exterior of the reactor 200 in the cooling step, similar to the growth step. A flow of the inert gas may be created in the internal space of the reactor. The inert gas may flow from the raw material 300 in the direction towards the silicon carbide seed crystal.

In the cutting step, the silicon carbide ingot recovered in the cutting step is cut into a wafer.

The silicon carbide ingot may be cut at an off angle with respect to the (0001) plane of the silicon carbide ingot or a plane where the silicon carbide ingot begins to grow. The off angle may be 0° to 10°.

The cutting step may be carried out such that the thickness of the wafer is 150 µm to 900 µm or 200 µm to 600 µm. However, the thickness of the wafer is not so limited.

In the processing step, the wafer may be planarized and the surface of the planarized wafer may be polished. For the wafer planarization, wheel grinding may be sequentially applied to both sides of the wafer to remove damage caused in the cutting step. This process is called lapping.

Grinding wheels manufactured by joining metals with coarse particle sizes have been used for silicon wafer processing. The use of such grinding wheels may pose a risk that cracks may be formed during silicon wafer grinding and the roughness of silicon wafers may be increased.

In the processing step, a first grinding wheel having a surface particle size in a finer range and a second grinding wheel having a surface particle size in a specific range can be used to reduce the roughness of the wafer while minimizing damage caused in the cutting step and to minimize the occurrence of particles, scratches, etc.

The processing step may include the substeps of processing with a first grinding wheel having a surface particle size of 1000 mesh to 3000 mesh (first processing substep) and processing with a second grinding wheel having a surface particle size of 6000 mesh to 10000 mesh (second processing substep).

The processing step can be carried out by bringing the surface of the rotating grinding wheel into contact with one surface of the wafer.

Particles may be embedded in the surface of the grinding wheels and their size is expressed as mesh. The mesh is indicative of the number of openings per inch. The particles may be, as non-limiting examples, diamond particles.

Each of the grinding wheels and the wafer may rotate in opposite directions.

Each of the grinding wheels may have a diameter larger than that of the wafer. The diameter of each of the grinding wheels may be not larger than 250 mm.

In the first processing substep, the feed rate of the first grinding wheel to the wafer may be 0.2 µm/s to less than 5 µm/s, 0.3 µm/s to 1.2 µm/s, or 0.5 µm/s to 1 µm/s. When the feed rate is in the range defined above, damage caused by the cutting can be removed while minimizing the occurrence of scratches.

In the first processing substep, the rotation rate of the first grinding wheel may be 1000 rpm to 2000 rpm or 1200 rpm to 1600 rpm. When the feed rate is in the range defined above, the wafer is protected from excessive grinding and damage caused by the cutting can be easily removed.

The grinding wheel used in the second processing substep may have a higher mesh value (that is, a smaller particle size) than the first grinding wheel implemented in the first processing substep.

In the second processing substep, the feed rate of the second grinding wheel to the wafer may be 0.2 µm/s to less than 1.5 µm/s, 0.2 µm/s to 1.2 µm/s, or 0.3 µm/s to 1.0 µm/s. When the feed rate is in the range defined above, surface irregularities of the wafer possibly caused by the first processing substep can be removed by polishing and the occurrence of scratches can be minimized.

In the second processing substep, the rotation rate of the second grinding wheel may be 600 rpm to 1800 rpm or 800 rpm to 1500 rpm. The rotation rate of the second grinding wheel may be lower than the rotation rate of the first grinding wheel. When the rotation rate of the second grinding wheel is in the range defined above, rough portions remaining on the surface of the wafer after the first processing substep may be removed, the occurrence of scratches may be minimized, and subsequent chemical mechanical polishing may be effectively performed.

The first processing substep and the second processing substep may be carried out without using slurry.

The processing step may further include the substep of wet etching the wafer after the second processing substep.

The processing step may further include the substep of chemical-mechanical polishing. The chemical-mechanical polishing may be performed after the second processing substep.

The chemical-mechanical polishing may be performed by bringing the wafer fixed to a rotating polishing head into contact with a slurry of abrasive particles under a predetermined pressure while supplying the slurry onto a rotating platen.

The method may further include the step of cleaning with a standard RCA chemical cleaning solution after the processing step.

The Pi value of the wafer may be not greater than 30, not greater than 20 or not greater than 15, as calculated by Equation 1 below:

$$Pi = Di \times Vi \times Vii \times 100$$

where Di is the density of the heat insulating material (g/cc), Vi is the feed rate of the first grinding wheel (µm/s), and Vii is the feed rate of the second grinding wheel (µm/s).

The Pi value may be 10 or less, 4.25 or less, or 2.7 or less. The Pi value may be 0.01 or more or 0.02 or more.

Pi is a wafer manufacture index related to the occurrence of defects. When Pi is below the predetermined value, the density of micropipes and the number of particles in the wafer may be minimized and the length of surface scratches can be controlled.

Wafer 10

Figure 1:
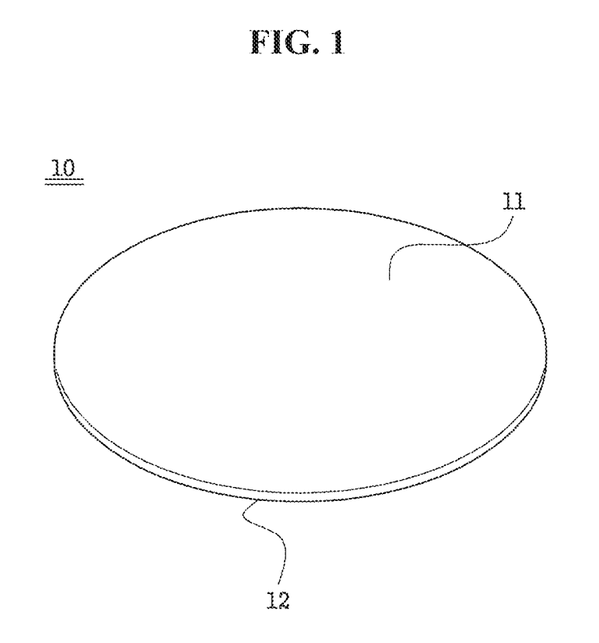
FIG. 1 illustrates a perspective view of an example wafer, in accordance with one or more embodiments.

Referring to FIG. 1, in an example, a wafer 10, in accordance with one or more embodiments, may include a first surface 11 and a second surface 12, wherein the total length of scratches on the first surface may not be greater than the diameter of the wafer, the average density of particles having a size of 0.3 μm or more is 3/cm² or less, and the average density of micropipes on the one surface is 3/cm² or less.

Particles having a size of 0.3 μm to 10 μm present in the wafer 10 may become starting points for the occurrence of defects when an epitaxial layer is formed on the wafer. The particles may include particles that are present in an internal space of a crucible and unintended metal particles formed during ingot growth.

Micropipes in the wafer 10 refer to hollow tubular defects that penetrate the wafer and have a diameter of about 1 μm to about 3 μm. Micropipes may cause poor electrical conductivity during device fabrication.

Micropipes, scratches, and particles in the wafer 10 may be classified and detected by an optical wafer inspection system (Candela CS20, KLA-Tencor).

The density of micropipes on the first surface of the wafer 10 may be 3/cm² or less, 2.46/cm² or less, 2.25/cm² or less, or 1.16/cm² or less.

The total length of scratches on the first surface of the wafer 10 represents the sum of the lengths of all scratches.

The percentage of the total length of scratches on the one surface of the wafer 10 relative to the diameter of the wafer may be 0.1% or less, 0.078% or less, or 0.031% or less.

The total length of scratches on the one surface of the wafer 10 may be 2 cm or less, 1.5 cm or less, 1.17 cm or less, or 0.47 cm or less.

The average density of particles on the one surface of the wafer 10 may be 3/cm² or less, 1.5/cm² or less, 0.8/cm² or less, 0.74/cm² or less, or 0.6/cm² or less.

The wafer 10 may have a Wd value not higher than 20 or not higher than 15, as calculated by Equation 2 below:

$$Wd=(MP+1)\times(Pd+1)\times(10Sr+1)$$

where MP is the average density of micropipes (/cm²), Pd is the average density of particles (/cm²), and Sr is the percentage of the total length of scratches relative to the diameter of the wafer (%).

The Wd value may be 12 or less, 10 or less, 5.2 or less or 4.9 or less. The Wd value may be 0.1 or more.

The Wd value is a wafer defect index comprehensively reflecting various factors, including micropipes, particles, and scratches, on the one surface of the wafer 10.

When the total length of scratches, the average density of particles, the average density of micropipes, and the Wd value are within the respective ranges defined above, the occurrence of defects in an epitaxial layer formed on the one surface of the wafer may be minimized and the characteristics and yield of a device can be improved.

Referring to FIG. 1, the first surface 11 of the wafer 10 may be a so-called Si plane where silicon atoms are mainly found on the surface, and the second surface 12, opposite to the first surface 11 is a so-called C plane where carbon atoms are mainly found on the surface. When the wafer is processed by a cutting process, the single-crystal silicon carbide may be cut at the interface between the carbon atomic layer and the silicon atomic layer, or in the direction parallel to the interface, with the result that a plane where carbon atoms are mainly exposed and a plane where silicon atoms are mainly exposed appear on the cut surfaces.

The wafer 10 may have a circular or elliptical shape in cross sectional. In this example, the center of the one surface 11 may correspond to the center of the circle or ellipse and the radius of the one surface 11 may correspond to the shortest radius of the circle or ellipse.

The wafer 10 may be cut from the ingot at an off angle of 0° to 10° with respect to the C plane (000-1) of the ingot or seed crystal.

The wafer 10 may have a rocking angle of −1.5° to 1.5°, −1.0° to 1.0°, −0.5° to 0.5°, or −0.3° to 0.3° with respect to a reference angle. Within this range, high crystal quality of the wafer is ensured. That is, the crystallinity of the wafer can be evaluated by the rocking angle. The rocking angle may be determined by the following procedure. First, the [11-20] direction of the wafer is adjusted to the X-ray path using a high-resolution X-ray diffraction system (HR-XRD system). The X-ray source optic and X-ray detector optic angles are set to 2θ (35° to 36°). Thereafter, a rocking curve is measured by controlling the omega (ω) or theta (θ) (X-ray detector optic) angle depending on the off angle of the wafer. The peak angle is defined as a reference angle. The differences between the reference angle and two full width at half maximum (FWHM) values are set to the rocking angle range.

As used herein, the expression "off angle of X°" means that the off angle is X° with a generally allowable error range. In an example, the off angle is in the range of (X°−0.05°) to (X°+0.05°). As used herein, the expression "rocking angle of −1° to 1° with respect to a reference angle" means that the full width at half maximum (FWHM) values are in the range of −1° to +1° with respect to the peak angle as a reference angle (that is, (peak angle−1°) to (peak angle+1°)). The rocking angle is determined by dividing the surface of the wafer, except for the central portion of the wafer and the portion 5 mm distant from the edge in the direction toward the center, into three substantially equal portions, measuring rocking angles at least three times in each of the portions, and averaging the measured results. Specifically, when the wafer is cut at an off angle of 0° to 10° with respect to the (0001) plane of the silicon carbide ingot, the omega angle is 17.8111° for an off angle of 0°, 13.811° for an off angle of 4°, and 9.8111° for an off angle of 8°.

The thickness of the wafer 10 may be 150 μm to 900 μm or 200 μm to 600 μm, which is suitably applicable to semiconductor devices, but is not limited thereto.

The wafer 10 may be composed substantially of 4H single-crystal silicon carbide in which a minimal number of defects or polymorphs are incorporated.

The wafer 10 may have a diameter of 4 inches or more, 5 inches or more or 6 inches or more. The diameter of the wafer may be 12 inches or less, 10 inches or less or 8 inches or less.

An epitaxial layer may be formed on the one surface of the wafer 10 by the following method.

Epitaxial Wafer Manufacturing Method

In another aspect, an epitaxial wafer manufacturing method, in accordance with one or more embodiments, includes the steps of injecting raw material gases for epitaxial growth into a growth container in which the wafer 10 is arranged, and growing an epitaxial layer on one surface 10 of the wafer by chemical vapor deposition (growth step).

The growth step may further include the substep of etching the surface of the wafer 10 with a gas before injection of the raw material gases. The gas etching can be performed by the addition of a predetermined amount of hydrogen gas while maintaining the wafer at a temperature of 1400° C. to 1600° C.

In the growth step, the wafer is first arranged in a growth container, the growth container is evacuated to a vacuum, and a carbonaceous gas and a silicon-based gas as the raw material gases are injected into the growth container. A doping gas such as nitrogen gas may be further injected into the growth container. The carbonaceous gas and the silicon-based gas are injected in such amounts that the concentration ratio of carbon atoms to silicon atoms is 0.5:1 to 2:1.

The carbonaceous gas can be selected from $CH_4$, $C_2H_4$, $C_2H_6$, $C_3H_6$, $C_3H_8$, and mixtures thereof and the silicon-based gas may be selected from $SiH_4$, $SiCl_4$, $SiHCl_3$, $SiH_2Cl_2$, $SiH_3Cl$, $Si_2H_6$, and mixtures thereof.

Figure 2:
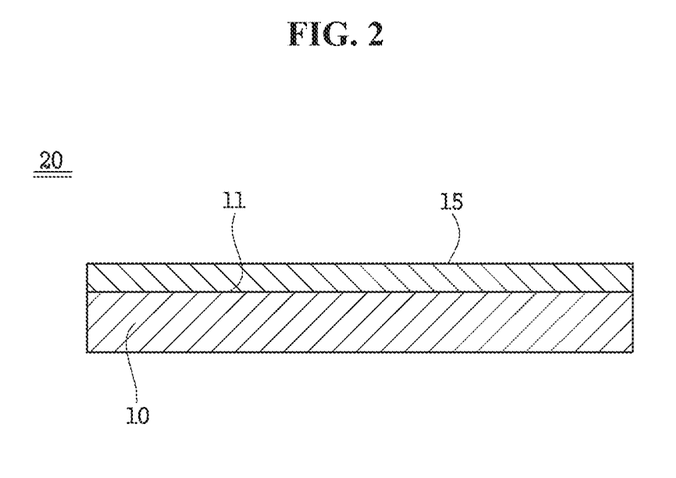
FIG. 2 illustrates a cross-sectional view of an example epitaxial wafer, in accordance with one or more embodiments.

In the growth step, an epitaxial layer may grow on the first surface 11 of the wafer 10 while maintaining a temperature of 1400° C. to 1700° C. after injection of the gases.

The grown epitaxial layer 15 of the epitaxial wafer 20 may be 5 μm to 20 μm in thickness.

After the growth step, the injection of the raw material gases is stopped, the growth container is cooled to room temperature and evacuated, the growth container is pressurized to atmospheric pressure with an inert gas, and the epitaxial wafer 20 is recovered.

The growth step may be repeated twice or more, if needed. In this example, a second epitaxial layer (not illustrated) may be formed on the epitaxial layer 15. The additional growth step for the formation of the second epitaxial layer may be carried out in the same manner as the growth step for the formation of the epitaxial layer 15. Alternatively, the temperature, the composition of the raw material gases, and the type of the doping gas in the additional growth step may be different from those in the growth step for the formation of the epitaxial layer 15.

The epitaxial wafer manufactured by the method has a low density of defects such as downfall, carrot, and triangular defects and exhibits excellent device characteristics.

Epitaxial Wafer 20

Referring to FIG. 2, in yet another example, an epitaxial wafer 20, in accordance with one or more embodiments, may include the wafer 10 and an epitaxial layer 15 formed on a first surface of the wafer 10.

In an example, the epitaxial layer 15 may have an average downfall defect density of $0.3/cm^2$ or less or $0.17/cm^2$ or less.

Figure 5A:
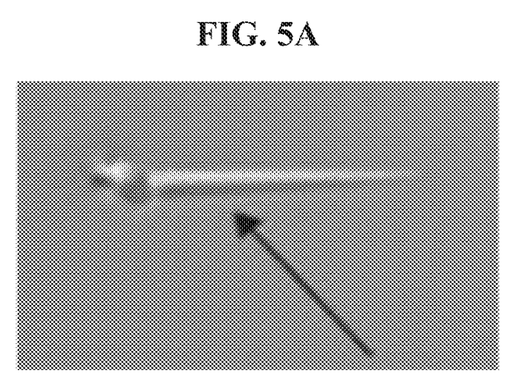
FIGS. 5A, 5B, and 5C illustrate images showing a carrot defect (FIG. 5A), a triangular defect (FIG. 5B), and a downfall defect formed in an epitaxial wafer (FIG. 5C).

The downfall defects may have a cylindrical shape that starts from particles in the wafer and extends in the thickness direction as an axis when the epitaxial layer is formed. In an example, the downfall defects may be formed by falling trace materials. The downfall defect may be in the form of a recess, as shown in f FIG. 5C.

In an example, the epitaxial layer 15 may have an average triangular defect density of $1/cm^2$ or less or $0.76/cm^2$ or less.

Figure 5B:
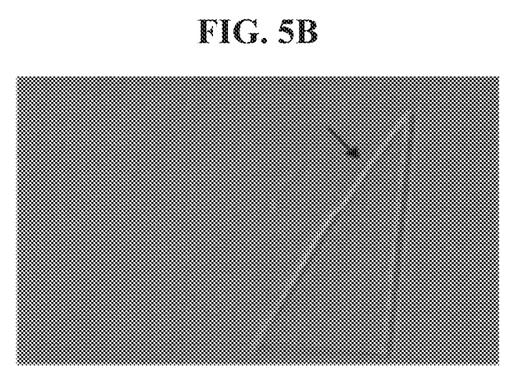
Figure 5C:
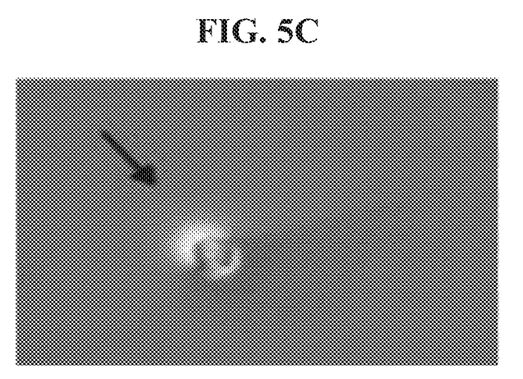

The triangular defects may be formed starting from scratches or particles in the wafer upon epitaxial growth on the wafer with a predetermined off angle. The triangular defect has a triangular shape, as shown in FIG. 5B.

In an example, the epitaxial layer 15 may have an average carrot defect density of $2/cm^2$ or less or $1.71/cm^2$ or less.

The carrot defects may grow in the step direction starting from threading screw dislocations in the wafer when the epitaxial layer is formed. The carrot defect has a carrot shape, as shown in FIG. 5A.

In an example, the epitaxial layer 15 may have an average edge dislocation defect density of $4/cm^2$ or less or $2.85/cm^2$ or less.

When the defect density ranges of the epitaxial wafer 20 are as defined above, better performance and higher yield of devices can be achieved.

The downfall, carrot, and triangular defects in the epitaxial wafer 20 may be classified and detected by an optical wafer inspection system (Candela CS20, KLA-Tencor). The inspection system may be used to measure the densities of the individual defects per unit area.

Referring to FIG. 2, the epitaxial layer 15 may be formed on the first surface 11 of the wafer 10. The thickness of the epitaxial layer may be 8 μm to 20 μm, but is not necessarily limited thereto.

The epitaxial layer 15 may include n- or p-type dopant atoms at a concentration of $1\times10^{14}/cm^3$ to $1\times10^{19}/cm^3$.

The epitaxial layer 15 may include silicon carbide.

The epitaxial layer 15 may be composed substantially of silicon carbide.

The epitaxial wafer 20 may further include a second epitaxial layer (not illustrated) formed on the epitaxial layer 15.

The second epitaxial layer may have the same features as the epitaxial layer 15 in terms of thickness, dopant atom content, and composition (components).

The second epitaxial layer may be identical to the epitaxial layer 15.

The epitaxial wafer 20 may be applied to Schottky barrier diodes, PIN diodes, metal semiconductor field transistors, etc. and can also be applied to other semiconductor devices.

The epitaxial wafer 20 can be manufactured by the method for manufacturing an epitaxial wafer, which has been described above.

Examples will be explained in more detail with reference to the following examples. However, these examples are merely illustrative to assist in understanding example embodiments and are not intended to limit the scope of example embodiments.

Production of Silicon Carbide Ingots and Manufacture of Wafers

The system illustrated in FIG. 4 was implemented to produce silicon carbide ingots. First, a silicon carbide powder as a raw material was loaded into the lower portion of the internal space of the reactor 200, and a silicon carbide seed crystal was arranged in the upper portion of the internal space. In an example, the silicon carbide seed crystal was composed of a 4H silicon carbide crystal having a diameter of 6 inches, and was fixed such that its C plane (000-1) was directed towards the silicon carbide raw material arranged in the lower portion of the internal space.

The reactor 200 was sealed, surrounded by the heat insulating material 400, and arranged in a quartz tube 500 provided with a heating coil as external heating devices 600. The density of the heat insulating material 400 is illustrated in Table 1. The internal space of the reactor was evacuated to a vacuum, argon gas was introduced into the internal space until the internal space reached 760 torr, and the internal space was depressurized. Simultaneously with the depressurization, the internal space was heated at a rate of 5° C./min to 2300° C. The amount of argon gas flowing in the quartz tube was controlled through the line 810 in communication with the quartz tube using the vacuum exhauster 700. A silicon carbide ingot was grown on the silicon carbide seed crystal facing the silicon carbide raw material at a temperature of 2300° C. and a pressure of 20 torr for 100 h.

After growth, the temperature of the internal space was reduced to 25° C. at a rate of 5° C./min, and simultaneously the pressure of the internal space was adjusted to 760 torr. The amount of argon gas flowing in the quartz tube was controlled through the line 810 in communication with the quartz tube using the vacuum exhauster 700.

The cooled silicon carbide ingot was cut at an off angle of 4° relative to its (0001) plane to manufacture a wafer having a thickness of 360 μm and a diameter of 150 mm.

The wafer was planarized and its surface was processed with a grinder (for example, HRG 200x, Accretech). Specifically, the surface of the planarized wafer was processed with a first grinding wheel embedded with 2000-mesh diamond particles at a rotation rate of 1400 rpm (primary processing), and was then processed with a second grinding wheel embedded with 8000-mesh diamond particles at a rotation rate of 1250 rpm (secondary processing). The feed rates of the grinding wheels to the wafer surface are illustrated in Table 1.

Subsequently, chemical mechanical polishing (CMP) was performed. The wafer sample was fixed to a polishing head of a CMP system and one surface of the wafer was directed towards a polyurethane polishing pad attached to a platen. Then, the one surface of the wafer was polished at a pressure of 5.4 psi with the addition of a silica slurry while rotating the platen at 200 rpm and the polishing head at 120 rpm. The polished wafer was cleaned and dried.

TABLE 1

| | Density of heat insulating material (g/cc) (Di) | Feed rate of first grinding wheel (μm/s) (Vi) | Feed rate of second grinding wheel (μm/s) (Vii) | Pi* | CMP |
|---|---|---|---|---|---|
| Example 1 | 0.18 | 0.5 | 0.3 | 2.70 | PU pad |
| Example 2 | 0.14 | 1 | 1 | 14.0 | SiO$_2$ slurry |
| Example 3 | 0.17 | 0.5 | 0.5 | 4.25 | 5.4 psi |
| Example 4 | 0.17 | 0.5 | 0.3 | 2.55 | Platen 200 rpm |
| Comparative Example 1 | 0.30 | 1.5 | 1.5 | 67.5 | Polishing head 120 rpm |
| Comparative Example 2 | 0.18 | 1.5 | 1.5 | 40.5 | |

*Pi = Di × Vi × Vii × 100

Measurement of Defects, Particles, and Scratches in the Wafers

The densities of micropipe defects, the densities of particles, and the lengths of scratches in the wafers were measured using an optical wafer inspection system (for example, Candela CS20, KLA-Tencor). The results are illustrated in Table 2.

Manufacture of Epitaxial Wafers

Each of the wafers was arranged in a growth container. SiH$_4$ and C$_3$H$_8$ gases as raw material gases for epitaxial growth and nitrogen as a doping gas were injected into the growth container to grow an epitaxial layer on a first surface of the wafer by chemical vapor deposition. The thickness of the epitaxial layer was 12 μm and the dopant concentration was $8 \times 10^{15}$/cm$^3$.

After growth, the injection of the raw material gases was stopped, the growth container was cooled to room temperature and evacuated, the growth container was pressurized to atmospheric pressure with an inert gas, and the epitaxial wafer 20 was recovered.

Measurement of Densities of Downfall, Triangular and Carrot Defects and Edge Dislocations in the Epitaxial Wafers The densities of defects in each of the epitaxial wafers were measured using an optical wafer inspection system (, for example, Candela CS20, KLA-Tencor). The results are illustrated in Table 2.

TABLE 2

| | Wafer | | | | Epitaxial wafer | | | |
|---|---|---|---|---|---|---|---|---|
| Example No. | MP (/cm$^2$) | Particles (/cm$^2$) (Pd) | Scratches (cm/wafer) | Wd | Downfall defects (/wafer) | Triangular defects (/wafer) | Carrot defects (/wafer) | Edge dislocations (/cm$^2$) |
| Example 1 | 2.25 | 0.60 | 0 | 5.2 | 30 | 133 | 301 | 2.85 |
| Example 2 | 2.46 | 0.55 | 1.17 | 9.5 | 17 | 122 | 30 | 2.82 |
| Example 3 | 1.16 | 0.74 | 0.47 | 4.9 | 21 | 46 | 142 | 1.28 |
| Example 4 | 0.01 | 0.80 | 0 | 1.8 | 6 | 33 | 15 | 0.33 |
| Comparative Example 1 | 5.92 | 0.88 | 4.52 | 52.2 | 72 | 226 | 462 | 3.96 |
| Comparative Example 2 | 4.98 | 0.79 | 1.82 | 23.7 | 59 | 154 | 398 | 3.04 |

MP: Micropipe,

Wd = (MP + 1) × (Pd + 1) × (10Sr + 1),

Sr = (scratches (cm/wafer)/wafer diameter (cm)) × 100

As can be seen from the results in Table 2, small numbers of scratches, particles, and micropipe defects were observed in the epitaxial wafers of Examples 1-4, which were manufactured by implementing the heat insulating material having a density of 0.14-0.28 g/cc for ingot growth and the first grinding wheel at a feed rate of 0.2 μm/s to less than 1.5 μm/s, and the second grinding wheel at a feed rate of 0.2 μm/s to less than 1.5 μm/s for wafer processing, and as a result, small numbers of defects were observed in the epitaxial wafers.

In contrast, relatively large numbers of micropipes and scratches were observed in the wafer of Comparative Example 2, which was manufactured by implementing the first and second grinding wheels at feed rates of 1.5 μm/s, and the wafer of Comparative Example 1, which was manufactured with the heat insulating material having a density of 0.30 g/cc. As a result, large numbers of defects were observed in the epitaxial wafers.

Furthermore, the wafers of Examples 1-4 with Pi values of less than 30 had Wd values of less than 15, whereas the wafers of Comparative Examples 1-2 with Pi values not lower than 30 had Wd values not lower than 23. The Pi value is a wafer defect index.

Figure 3A:
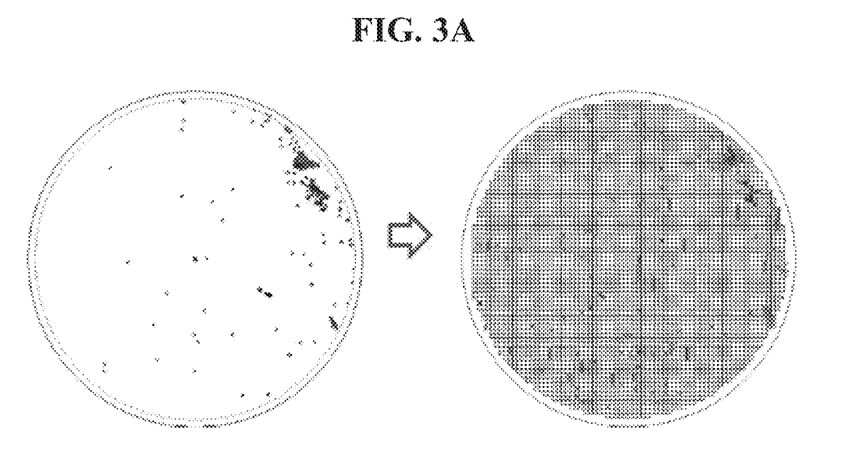
FIGS. 3A and 3B illustrate images of the occurrence of defects before (left) and after (right) the formation of an epitaxial layer in each of (a) Comparative Example 1 and (b) Example 4.
Figure 3B:
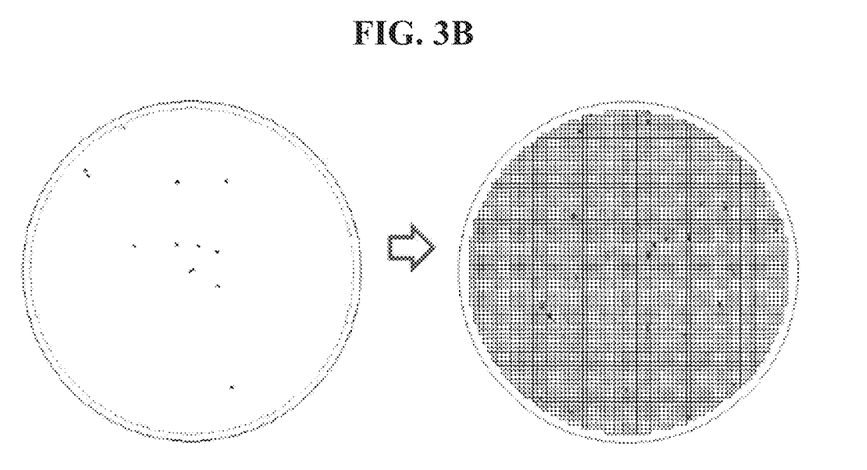

The numbers of defects in the wafer and the epitaxial wafer of Comparative Example 1 were visually identified in the left and right sides of FIG. 3A, respectively. The numbers of defects in the wafer and the epitaxial wafer of Example 4 were visually identified in the left and right sides of FIG. 3B, respectively.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A wafer manufacturing method, the method comprising:
arranging a raw material and a silicon carbide seed crystal to face each other in a reactor having an internal space;
controlling a temperature, a pressure, and an atmosphere of the internal space to sublimate the raw material, and grow a silicon carbide ingot from the silicon carbide seed crystal;
cooling the reactor, and recovering the silicon carbide ingot;
cutting the recovered silicon carbide ingot into a wafer; and
planarizing the wafer, and polishing a first surface of the planarized wafer,
wherein a heat insulating material surrounds an outer surface of the reactor, a heating device is configured to control the temperature of the internal space, and a density of the heat insulating material is 0.14 g/cc to 0.28 g/cc,
wherein the planarizing of the wafer comprises performing a first processing operation with a first grinding wheel which has a surface particle size of 1000 mesh to 3000 mesh, and performing a second processing operation with a second grinding wheel which has a surface particle size of 6000 mesh to 10000 mesh,
wherein the planarizing of the wafer further comprises performing a chemical mechanical polishing operation, and
wherein after chemical mechanical polishing is performed on the wafer, a total length of scratches on a first surface of the wafer is less than a diameter of the wafer, an averaae density of particles has a size of 0.3 μm or more is 3/cm2 or less, and an average density of micropipes on the first surface is 3/cm2 or less.

2. The method of claim 1, wherein a feed rate of the first grinding wheel to the wafer in the first processing operation is 0.2 μm/s to less than 1.5 μm/s.

3. The method of claim 1, wherein a feed rate of the second grinding wheel to the wafer in the second processing operation is 0.2 μm/s to less than 1.5 μm/s.

4. The method of claim 1, wherein a wafer manufacture index (Pi) value of the wafer is not greater than 30, based on the following Equation:

$$Pi = Di \times Vi \times Vii \times 100$$

where Di is the density of the heat insulating material (g/cc), Vi is the feed rate of the first grinding wheel (μm/s), and Vii is the feed rate of the second grinding wheel (μm/s).

5. The method of claim 1, wherein the first grinding wheel is configured to rotate at a rate of 1000 rpm to 2000 rpm.

6. The method of claim 1, wherein the second grinding wheel is configured to rotate at a rate of 600 rpm to 1800 rpm.

* * * * *